United States Patent [19]
Bhatnagar et al.

[11] Patent Number: 5,780,878
[45] Date of Patent: Jul. 14, 1998

[54] LATERAL GATE, VERTICAL DRIFT REGION TRANSISTOR

[75] Inventors: Mohit Bhatnagar; Charles E. Weitzel, both of Mesa, Ariz.

[73] Assignee: Motorola, Inc., Schaumburg, Ill.

[21] Appl. No.: 681,684

[22] Filed: Jul. 29, 1996

[51] Int. Cl.$^6$ .................................................. H01L 29/76
[52] U.S. Cl. .................... 257/139; 257/133; 257/147; 257/212; 257/342; 257/77; 257/329
[58] Field of Search ..................... 257/341, 342, 257/335, 339, 77, 329, 133, 139, 147, 212

[56] References Cited

U.S. PATENT DOCUMENTS

| | | | |
|---|---|---|---|
| 5,077,589 | 12/1991 | Holm et al. | 257/342 |
| 5,338,945 | 8/1994 | Baliga et al. | 357/77 |
| 5,396,087 | 3/1995 | Baliga | 257/342 |

FOREIGN PATENT DOCUMENTS

| | | | |
|---|---|---|---|
| 3-157974 | 7/1991 | Japan | 257/342 |

*Primary Examiner*—Tom Thomas
*Assistant Examiner*—David B. Hardy
*Attorney, Agent, or Firm*—Eugene A. Parsons

[57] ABSTRACT

A lateral gate, vertical drift region transistor including a drain positioned on one surface of a substrate and a doped structure having a buried region therein positioned on the other surface of the substrate. The buried region defining a drift region in the doped structure extending vertically from the substrate and further defining a doped region in communication with the drift region and adjacent the surface of the doped structure. A source positioned on the doped structure in communication with the doped region. An insulating layer positioned on the doped structure with a metal gate positioned on the insulating layer so as to define an accumulation region extending laterally adjacent the control terminal and communicating with the drift region and the source.

10 Claims, 4 Drawing Sheets

LATERAL GATE, VERTICAL DRIFT REGION TRANSISTOR

FIELD OF THE INVENTION

The present invention pertains to transistors and the fabrication thereof, and more specifically to lateral gate, vertical drift transistors.

BACKGROUND OF THE INVENTION

One of the leading semiconductor products at the present time is metal-oxide-semiconductor field-effect-transistors (MOSFET). These devices are especially useful as power devices in high voltage, high current applications. However, as power devices and to increase their utility or versatility, the MOSFET should have a low ON-resistance, good switching characteristics (e.g. switching times, etc.), low leakage currents, high channel density, etc.

Conventionally, for power device related applications, silicon based power MOSFETs or IGBTs are used. However, Si MOSFETs have very high ON-resistance for high breakdown voltage ratings and IGBTs exhibit very poor switching characteristics. In another silicon device, referred to as double diffusion MOSFETs (DMOSFETs), gate-control occurs through an inversion channel that is formed in p-conductivity material along the lateral surface. However, due to the lack of manufacturable diffusion technology for silicon carbide, DMOSFET techniques cannot be used to fabricate SiC MOSFETs. Also, the inversion channel in the DMOSFETs is provided by forming gate oxide on p-conductivity material between the source and gate and for SiC this results in a poor quality of oxide with high fixed charges and a large number of traps at the oxide/SiC interface. This results in a reduction of the mobility of the carriers (electrons) that produce the current in the device and this reduction in the mobility of the electrons severely degrades the ON-resistance of the device.

An alternative, vertical structure for silicon carbide is a UMOSFET disclosed in U.S. Pat. No. 5,233,215, entitled "Silicon Carbide Power MOSFET with Floating Field Ring and Floating Field Plate" and issued Aug. 3, 1993. In the UMOSFET an inversion channel is formed by an MOS gate along an etched trench. In the UMOSFET, the gate oxide is again formed on a p-conductivity layer, which produces a poor quality oxide and high ON-resistance for SiC based FETs Accordingly, it would be highly advantageous to have a manufacturable MOSFET with low ON-resistance, good switching characteristics (e.g. switching times, etc.), low leakage currents, high channel density, etc.

It is a purpose of the present invention to provide a new and improved MOSFET.

It is another purpose of the present invention to provide a new and improved MOSFET with low ON-resistance good switching characteristics, low leakage current, and high channel density.

It is a further purpose of the present invention to provide a new and improved MOSFET which can be fabricated in a silicon carbide material system.

SUMMARY OF THE INVENTION

The above problems and others are at least partially solved and the above purposes and others are realized in a lateral gate, vertical drift region transistor including a semiconductor substrate having a first surface and an opposite surface with a first current terminal positioned on the opposite surface. A doped structure is formed with a buried region positioned therein. The doped structure is positioned on the first surface of the substrate and defines a surface parallel with and spaced from the first surface of the substrate. The buried region is positioned in the doped structure so as to define a drift region in the doped structure extending from and generally perpendicular to the first surface of the substrate. The buried region is further positioned in the doped structure so as to define a doped region in communication with the drift region and adjacent the surface of the doped structure. A second current terminal is positioned on the doped structure in communication with the doped region. An insulating layer is positioned on the surface of the doped structure overlying the doped region and a control terminal is positioned on the insulating layer so as to define an accumulation region in the doped region, the accumulation region extending laterally adjacent to the control terminal and in communication with the drift region and the second current terminal.

Generally, the substrate and doped structure are a first conductivity type and the buried region is a second conductivity type.

The buried region can be formed in several different embodiments, including implanting particles in an epitaxial layer, forming a first epitaxial layer on the substrate, forming a second epitaxial layer on the first epitaxial layer and defining the buried layer in the second epitaxial layer, and forming a third epitaxial layer on the second epitaxial layer, the third epitaxial layer defining the accumulation region.

BRIEF DESCRIPTION OF THE DRAWINGS

Referring to the drawings.

DESCRIPTION OF THE PREFERRED EMBODIMENTS

Figure 1:
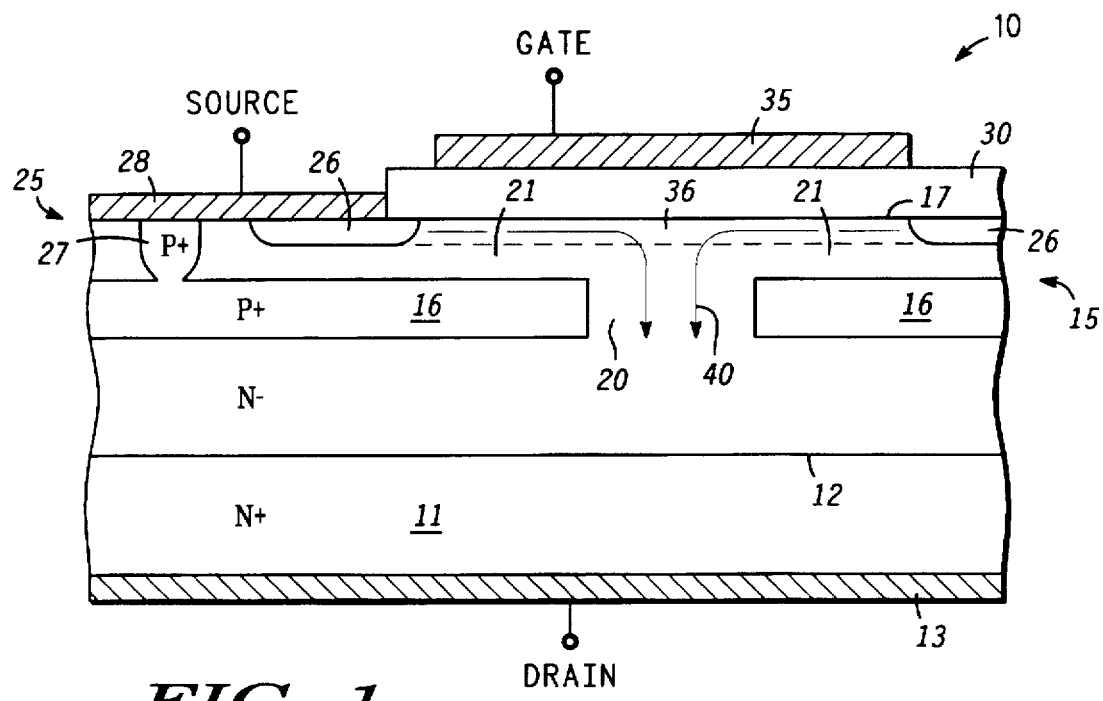
FIG. 1 is a simplified sectional view of a transistor in accordance with the present invention.

Referring specifically to FIG. 1, a simplified sectional view is illustrated of a lateral gate, vertical drift region transistor 10 in accordance with the present invention. Transistor 10 includes a semiconductor substrate 11 with an upper surface 12, which may be any convenient semiconductor material, such as silicon, silicon carbide, gallium arsenide, gallium nitride, etc., doped for a first type of conductivity. In this preferred embodiment, substrate 11 is formed of silicon carbide and is heavily doped ($N^+$) for n-conductivity. A layer 13 of metal is deposited on a lower or rear surface of substrate 11 and processed to form an ohmic contact by techniques well known by those skilled in the art. In this embodiment, layer 13 is a drain terminal for transistor 10. It will be understood that layer 13 can be deposited at any convenient time throughout the fabrication process and the description is included at this time for simplicity of understanding.

A doped structure 15, having a buried region 16 positioned therein, is positioned on surface 12 of substrate 11 and defines a surface 17 parallel with and spaced from surface 12 of the substrate. Buried region 16 is positioned in doped structure 15 so as to define a drift region 20 in doped structure 15 extending from and generally perpendicular to surface 12 of the substrate 11. The thickness and the doping of drift region 20 are designed to support a given breakdown voltage using basic device physics. Further, buried region 16 is positioned in doped structure 15 so as to define a doped region 21 in communication with drift region 20 and adjacent surface 17 of doped structure 15. While buried region 16 appears in FIG. 1 as two spaced apart portions, it will be understood by those skilled in the art that transistor 10 is normally constructed with a closed formation, i.e. buried region 16 may appear circular, race-track shaped, serpentine, etc in a top plan, all such formations being well known in the art.

A second current terminal 25 is positioned on doped structure 15 in communication with doped region 21. Second current terminal 25, which in this embodiment is a source terminal of transistor 10, includes an implant area 26 adjacent surface 17 which is heavily doped (N$^+$) with the first conductivity type. Second current terminal 25 is electrically coupled to buried region 16 as, for example, by means of an implant area 27 that extends between buried region 16 and surface 17 of doped structure 15 and is spaced from implant area 26. A metal layer 28 is deposited on surface 17 in electrical contact with implant area 26 and implant area 27 and is processed in a well known manner to provide an ohmic contact between metal layer 28 and implant areas 26 and 27.

An insulating layer 30 is positioned on surface 17 of doped structure 15 in overlying relationship to doped region 21. Generally, insulating layer 30 overlies surface 17 within (between) implant areas 26. In a preferred embodiment insulating layer 30 is an oxide or nitride grown on surface 17. Because doped region 21 is an n-conductivity material, the quality of the oxide grown thereon is relatively good and there are no problems with the interface or with fixed charges in the material thereunder. A metal layer 35 is deposited on layer 30 and processed in a well known manner to produce a contact which operates as a gate terminal. The MOS gate is preferable (over a Schottky gate) for controlling current in the channel region because of lower accumulation channel resistance in power devices. Also, the MOS gate offers lower gate leakage current over, for example, Schottky gates. Metal layer 35 defines an accumulation region 36 in doped region 21 adjacent surface 17. Accumulation region 36 extends laterally adjacent the gate terminal between drift region 20 and implant area 26. When properly energized by potentials applied between the source, drain and gate terminals in a well known fashion, transistor 10 conducts current from source 28, implants 26, accumulation region 36, drift region 20, and substrate 11 to drain terminal 13, as represented by arrows 40.

Figure 2:
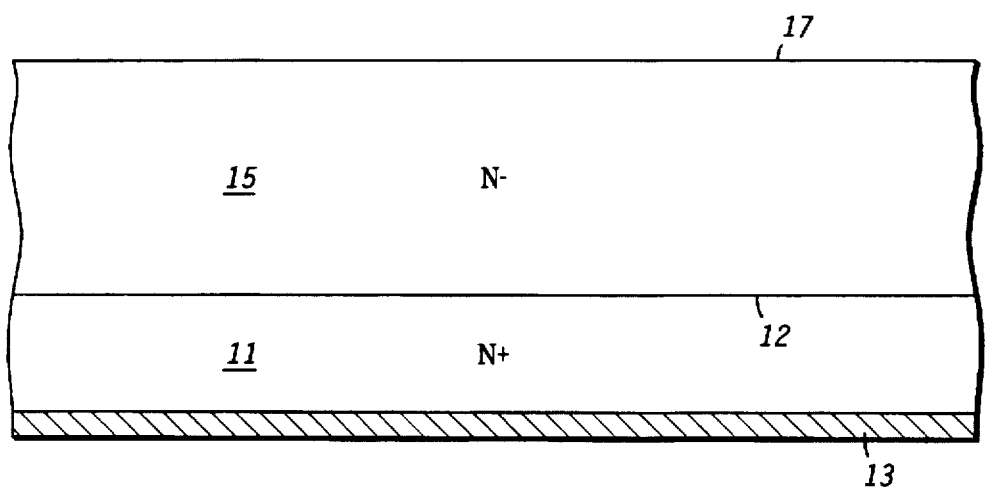
FIGS. 2–4 illustrate several steps in a method of fabricating the transistor of FIG. 1.
Figure 3:
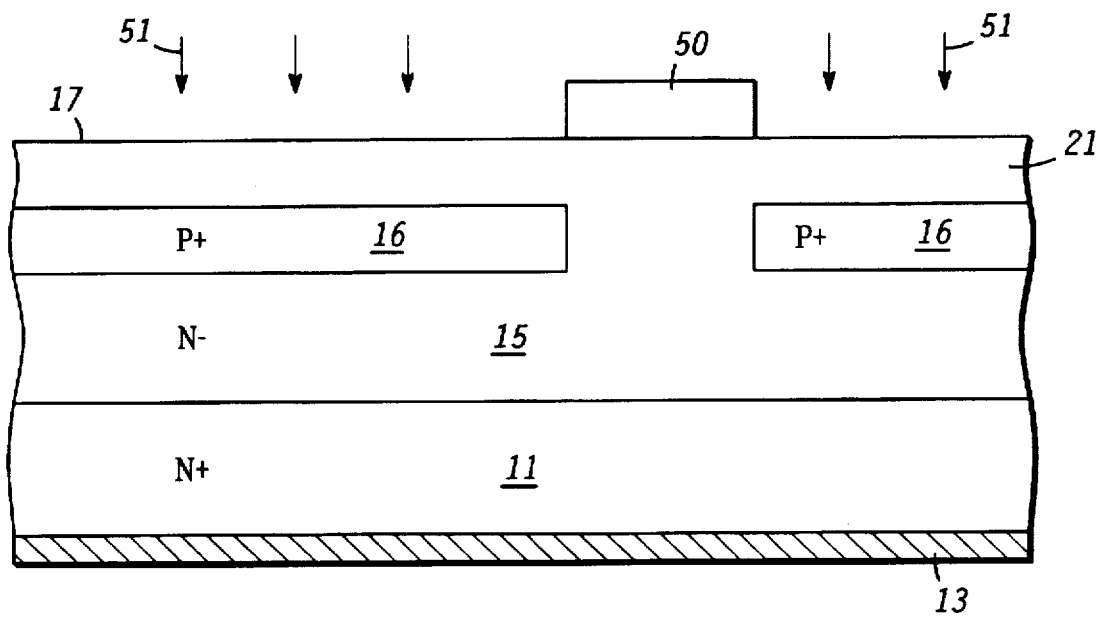
Figure 4:
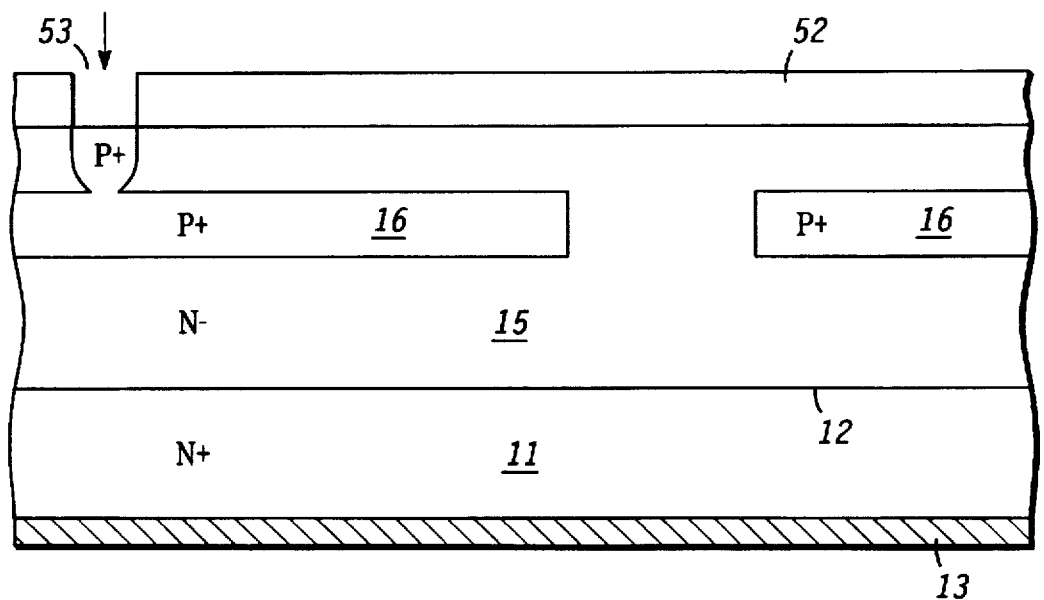

Turning now to FIGS. 2-4, several steps in one process for fabricating buried layer 16 in transistor 10 are illustrated. Components which are similar to components of transistor 10 in FIG. 1 are designated with the same numbers to aid in comparing the devices. Referring specifically to FIG. 2, a semiconductor substrate 11, in this example a silicon carbide substrate, having an upper surface 12 is provided and a current contact 13 is formed on the lower surface. Substrate 11 is heavily doped for N-conductivity. A relatively thick epitaxial layer 15 lightly doped for N-conductivity is epitaxially grown on surface 12 utilizing any of the well known processes. Epitaxial layer 15 represents doped structure 15 described in conjunction with FIG. 1 and defines an upper surface 17.

Turning to FIG. 3, an implant mask 50 is formed on surface 17 of epitaxial layer 15 in any well known manner.

For example, a combination of metal layers and photoresist are deposited on surface 17 and patterned by exposing the photoresist and then using it to etch the metal. The patterned metal and remaining photoresist, if convenient, is then used as a mask to deeply implant particles into epitaxial layer 15, whereby buried layer 16 is formed. Buried layer 16 has a P-conductivity and any material which will provide this conductivity and is capable of being deeply implanted can be used.

In a specific example, the upper surface of buried layer 16 is in the range of approximately 0.2 μm to 0.3 μm below surface 17 and the lower surface is in the range of approximately 0.7 μm to 1.1 μm below surface 17. Also, the lower surface of buried layer 16 is in the range of 5 μm to 35 μm from surface 12 of substrate 11. In this example the particles forming buried layer 16 are implanted (represented by arrows 51) with a density of 5E15 to 5E16 at an energy in the range of 200 KeV to 1 MeV to achieve the desired depth. With buried layer 16 properly formed, implant mask 50 is removed.

Turning to FIG. 4, a new implant mask 52 is formed by deposition and patterning similar to that described above. In this step implant mask 52 covers the entire surface 17, except for an area 53 directly above buried layer 16. Particles are implanted through area 53 into doped region 21, defined by buried region 16, to form a heavily doped P-conductivity region 27 extending from buried region 16 to surface 17 of epitaxial layer 15. The particles are implanted from a depth in the range of approximately 0.2 μm to 0.3 μm with a density in the range of 5E15 to 5E16 and an energy in the range of 50 KeV to 300 KeV. Region 27 is provided to form an electrical connection between buried region 16 and the source terminal.

Figure 5:
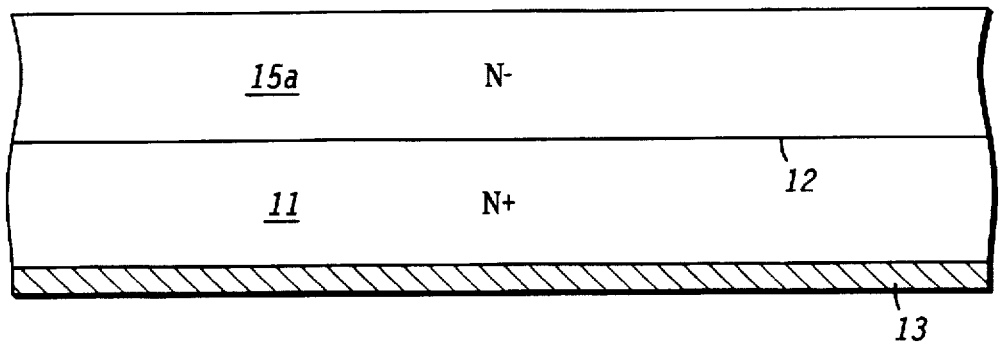
FIGS. 5–7 illustrate several steps in another method of fabricating the transistor of FIG. 1.
Figure 6:
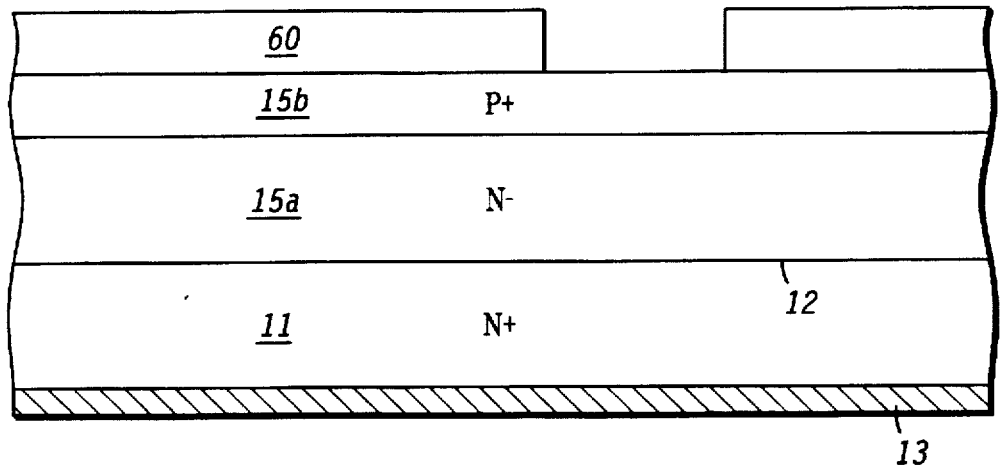
Figure 7:
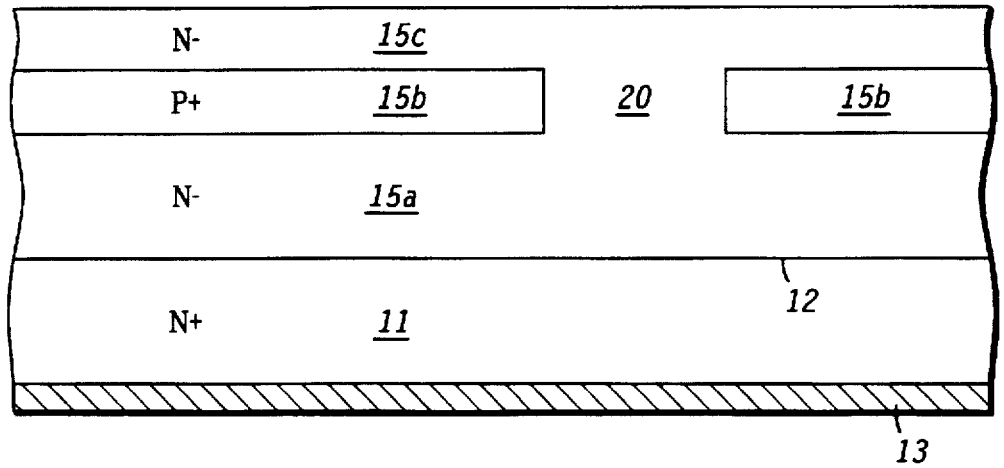

Turning now to FIGS. 5-7, several steps in another process for fabricating buried layer 16 in transistor 10 is illustrated. Components which are similar to components of transistor 10 in FIG. 1 are designated with the same numbers to aid in comparing the devices. Referring specifically to FIG. 5, a semiconductor substrate 11 having an upper surface 12 is provided and a current contact 13 is formed on the lower surface. Substrate 11 is heavily doped for N-conductivity. A first epitaxial layer 15a lightly doped for N-conductivity is epitaxially grown on surface 12 utilizing any of the well known processes. Epitaxial layer 15a represents a first portion of doped structure 15 described in conjunction with FIG. 1.

Turning to FIG. 6, a second epitaxial layer 15b heavily doped for P-conductivity is grown on first epitaxial layer 15a utilizing any of the well known processes. An etch mask 60 is formed on the upper surface of epitaxial layer 15b in any well known technique, such as photoresist or metal and patterning. Etch mask 60 is then used to etch an opening through epitaxial layer 15b, which opening will ultimately define drift region 20. A third epitaxial layer 15c is then epitaxially grown over layer 15b, including the opening therethrough. Because epitaxial layer 15b is relatively thin (0.4 μm to 0.9 μm), the nonuniformity which would be produced by the opening (drift region 20) in epitaxial layer 15b can be compensated for relatively simply, if necessary, with an additional mask and growth stage in the opening after which the mask is removed and the complete layer 15c is grown, as illustrated in FIG. 7.

Figure 8:
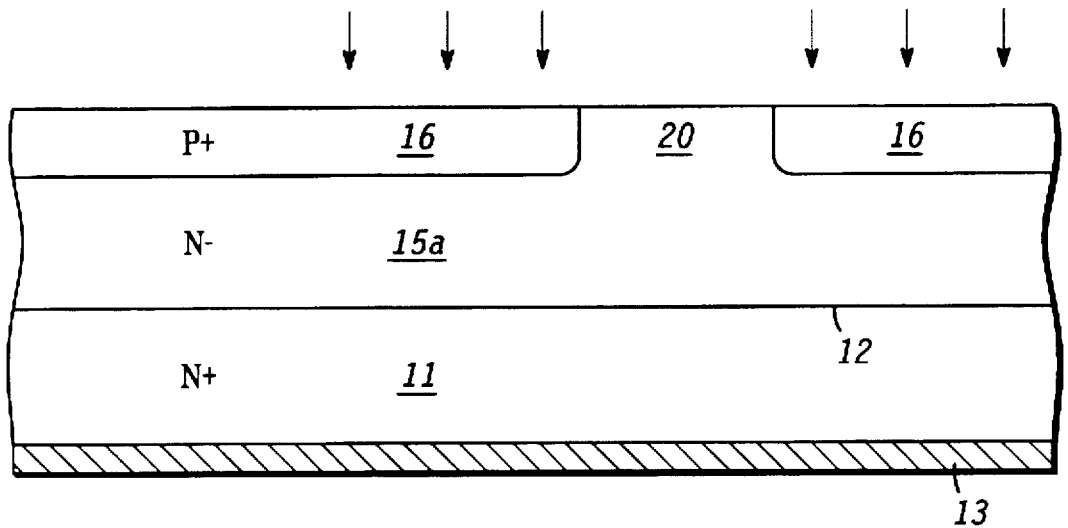
FIGS. 8–9 illustrate several steps in another method of fabricating the transistor of FIG. 1.
Figure 9:
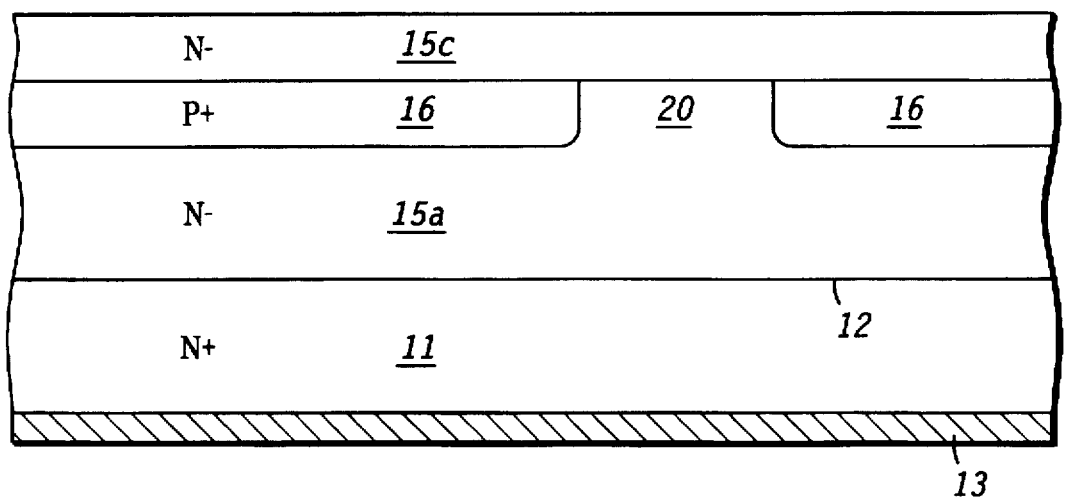

Turning now to FIGS. 8-9, several steps in yet another process for fabricating buried layer 16 in transistor 10 is illustrated. Components which are similar to components of transistor 10 in FIG. 1 (also the method of FIGS. 5-7) are designated with the same numbers to aid in comparing the devices and methods. In this embodiment it is again assumed that the structure of FIG. 5 is the starting point. After growing epitaxial layer 15a (FIG. 5), buried layer 16 is formed by ion-implantation into epitaxial layer 15a, patterning the ion implant to define drift region 20 therethrough. The ion-implantation can be performed using any of the standard techniques known in the art, generally including an implant mask (not shown). Channel layer 15c is then grown on top of implanted buried layer 16 and drift region 20, as illustrated in FIG. 9.

Accordingly, a new and improved MOSFET is disclosed including a vertical drift region, MOS gate control, a lateral gate or channel region, and an accumulation layer. Further, the improved MOSFET can easily be fabricated in a SiC material system, in a silicon system, in a gallium arsenide system, etc. Generally, a SiC material system is preferred because of the lower ON-resistance, especially for high power applications. The vertical drift region provides higher channel density and a substantial savings in semiconductor substrate real estate. The MOS gate control provides higher transconductance and reduced gate leakage current. The lateral gate or channel region provides improved oxide and an improved epitaxial layer to oxide (SiC/SiO2) interface. The accumulation region provides a 5 to 10 improvement factor in particle mobility over prior art inversion layer devices and a lower ON-resistance. Thus, a new and improved MOSFET with low ON-resistance, good switching characteristics, low leakage current, and high channel density is disclosed.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A lateral gate, vertical drift region transistor comprising:

a semiconductor substrate having a first surface and an opposite surface with a first current terminal positioned on the opposite surface;

a doped structure having a buried region positioned therein, the doped structure being positioned on the first surface of the substrate and defining a surface parallel with and spaced from the first surface of the substrate, the buried region being positioned in the doped structure so as to define a drift region in the doped structure extending from and generally perpendicular to the first surface of the substrate, the buried region being further positioned in the doped structure so as to define a doped region in communication with the drift region and adjacent the surface of the doped structure, and the substrate and doped structure having a first conductivity and the buried region having an opposite conductivity;

a second current terminal positioned on the doped structure in communication with the doped region;

an insulating layer positioned on the surface of the doped structure overlying the doped region; and a control terminal positioned on the insulating layer so as to define an accumulation region in the doped region, the accumulation region extending laterally adjacent the control terminal and communicating with the drift region and the second current terminal.

2. The lateral gate, vertical drift region transistor as claimed in claim 1 wherein the insulating layer is one of an oxide and a nitride.

3. The lateral gate, vertical drift region transistor as claimed in claim 2 wherein the insulating layer is oxide and the control terminal includes a layer of metal positioned on the oxide to form a metal-oxide-semiconductor transistor.

4. The lateral gate, vertical drift region transistor as claimed in claim 1 wherein the substrate includes silicon carbide.

5. The lateral gate, vertical drift region transistor as claimed in claim 1 wherein the buried region is electrically coupled to the second current terminal.

6. The lateral gate, vertical drift region transistor as claimed in claim 1 wherein the doped structure includes an epitaxial layer grown on the substrate.

7. The lateral gate, vertical drift region transistor as claimed in claim 6 wherein the buried region includes an implant in the doped structure.

8. The lateral gate, vertical drift region transistor as claimed in claim 7 wherein the implant is electrically coupled to the second current terminal by an additional implant.

9. The lateral gate, vertical drift region transistor as claimed in claim 1 wherein the doped structure includes a first epitaxial layer with a first conductivity grown on the substrate, a second epitaxial layer with a second conductivity grown on the first epitaxial layer and defining the buried region, and a third epitaxial layer grown on the second epitaxial layer.

10. A lateral gate, vertical drift region transistor comprising:

a semiconductor substrate with a first conductivity having a first surface and an opposite surface with a first current terminal positioned on the opposite surface;

a doped epitaxial structure with the first conductivity having a buried region of an opposite conductivity positioned therein, the epitaxial structure being positioned on the first surface of the substrate and defining a surface parallel with and spaced from the first surface of the substrate, the buried region being positioned in the epitaxial structure so as to define a drift region in the epitaxial structure extending from and generally perpendicular to the first surface of the substrate, the buried region being further positioned in the epitaxial structure so as to define a laterally extending doped region in communication with the drift region and adjacent the surface of the epitaxial structure;

a second current terminal positioned on the epitaxial structure in communication with the doped region and electrically coupled to the buried region;

a dielectric layer including one of an oxide and a nitride formed on the surface of the epitaxial structure overlying the doped region; and a metal layer forming a control terminal and positioned on the dielectric layer so as to define an accumulation region in the doped region, the accumulation region extending laterally adjacent the control terminal and communicating with the drift region and the second current terminal.

* * * * *